United States Patent [19]

Whight et al.

[11] Patent Number: 5,223,919
[45] Date of Patent: Jun. 29, 1993

[54] PHOTOSENSITIVE DEVICE SUITABLE FOR HIGH VOLTAGE OPERATION

[75] Inventors: Kenneth R. Whight, Partridge Green; John A. G. Slatter, Crawley Down; David J. Coe, East Grinstead, all of England

[73] Assignee: U. S. Philips Corp., New York, N.Y.

[21] Appl. No.: 949,328

[22] Filed: Sep. 22, 1992

Related U.S. Application Data

[63] Continuation of Ser. No. 759,700, Sep. 10, 1991, abandoned, which is a continuation of Ser. No. 581,450, Sep. 7, 1990, abandoned, which is a continuation of Ser. No. 157,446, Feb. 17, 1988, abandoned.

[30] Foreign Application Priority Data

Feb. 25, 1987 [GB] United Kingdom ............... 8704401

[51] Int. Cl.⁵ ................ H01L 29/34; H01L 29/40; H01L 27/14
[52] U.S. Cl. ................... 257/459; 257/461; 257/490; 257/492; 257/493; 257/494; 257/653
[58] Field of Search ............ 357/53, 52, 30 D; 257/454, 461, 488, 490, 492, 493, 494, 653

[56] References Cited

U.S. PATENT DOCUMENTS

| | | | |
|---|---|---|---|
| 3,463,977 | 8/1969 | Grove et al. | 357/53 |
| 3,978,511 | 8/1976 | Digoy | 357/52 |
| 4,127,932 | 12/1978 | Hartman et al. | 357/13 |
| 4,137,428 | 1/1979 | Federico et al. | 357/46 |
| 4,326,211 | 4/1982 | Smeets | 357/13 |
| 4,383,266 | 5/1983 | Sakai et al. | 357/52 |
| 4,616,247 | 10/1986 | Chang et al. | 357/13 |
| 4,631,592 | 12/1986 | Nishizawa | 357/30 R |
| 4,779,126 | 10/1988 | Herman | 357/52 |
| 4,805,004 | 2/1989 | Gandolfi et al. | 357/53 |
| 4,816,890 | 3/1989 | Ouchi et al. | 357/16 |
| 4,866,499 | 9/1987 | Akisk | 357/15 |

FOREIGN PATENT DOCUMENTS

| | | | |
|---|---|---|---|
| 54-107375 | 8/1979 | Japan | 357/30 D |
| 58-61682 | 4/1983 | Japan | 357/30 D |

Primary Examiner—Andrew J. James
Assistant Examiner—Ngan Van Ngo
Attorney, Agent, or Firm—Steven R. Biren

[57] ABSTRACT

A photosensitive device includes a semiconductor body (1) having a first region (2) of one conductivity type adjacent a given surface (3) of the body with a second region (4) of the opposite conductivity type surrounding the first region (2) so as to form with the first region a main pn junction (5) terminating at the given surface (3), the main pn junction (5) being reverse-biassed in operation of the device. One or more further regions (6) of the one conductivity type surround the main pn junction (5) adjacent the given surface (3) so that each further region (6) forms a photosensitive pn junction (17) with the second region (4), the further region(s) (6) lying within the spread of the depletion region of the main pn junction (5) when the main pn junction (5) is reverse-biassed in operation of the device so as to increase the breakdown voltage of the main pn junction (5). Means are provided for transmitting light into the semiconductor body via the given surface to enable photogeneration of charge carriers in the vicinity of the photosensitive pn junction(s) (17). The further region(s) may include one or more annular floating regions (6″) spaced apart from the main pn junction(s) and each other.

11 Claims, 2 Drawing Sheets

PHOTOSENSITIVE DEVICE SUITABLE FOR HIGH VOLTAGE OPERATION

This is a continuation of U.S. patent application Ser. No. 07/759,700, filed Sep. 10, 1991, now abandoned, which is a continuation of U.S. patent Ser. No. 07/581,450 filed Sep. 7, 1990, now abandoned, which is a continuation of U.S. patent Ser. No. 07/157,446 filed Feb. 17, 1988, now abandoned.

BACKGROUND OF THE INVENTION

This invention relates to a photosensitive device, especially a photosensitive device capable of high voltage operation.

Photosensitive devices have been proposed which include a semiconductor body having a first region of one conductivity type adjacent a given surface of the body, a second region of the opposite conductivity type surrounding the first region so as to form with the first region a photosensitive main pn junction, means for transmitting light into the semiconductor body via the given surface to enable photogeneration of charge carriers in the vicinity of the photosensitive main pn junction and a further region, of the one conductivity type surrounding the photosensitive main pn junction to form a pn junction with the second region, the further region lying within the spread of the depletion region of the photosensitive main pn junction when the photosensitive main pn junction is reverse-biassed in operation of the device, so as to increase the breakdown voltage of the photosensitive main pn junction.

GB-A-1,357,432 describes such a photosensitive device. In particular, GB-A-1,357,432 describes a photosensitive diode in which the photosensitive main pn junction is surrounded by a guard ring which meets the given surface and is spaced apart from the photosensitive main pn junction forming a pn junction with the second region. The guard ring serves to reduce leakage currents and to increase the breakdown voltage of the photosensitive main pn junction. As described in the specification, in addition to the required diode terminals, a contact is provided on the guard ring. The photosensitive junction is essentially provided between a large-area shallow light collecting subsidiary region of the first region and the second region, contact metallization being provided on a deeper subsidiary region of the first region surrounding the light collecting subsidiary region. Should a photosensitive transistor be required, then an annular emitter region can be provided within the first region so as to be within the deeper subsidiary regions of the first region which forms the base of the transistor, contact metallization being provided on the surface of the emitter region.

In order to increase further the breakdown voltage of the photosensitive main pn junction, additional guard rings, for example floating rings or another high voltage edge termination system, may be provided around the photosensitive main pn junction. However, as the desired breakdown voltage becomes higher, the area of the device consumed by the edge termination system comes to dominate the device area and may result in the active area available for light collection or amplification having to be reduced.

SUMMARY OF THE INVENTION

According to the present invention, there is provided a photosensitive device comprising a semiconductor body having a first region of one conductivity type adjacent a given surface of the body, a second region of the opposite conductivity type surrounding the first region so as to form with the first region a main pn junction terminating at the given surface, the main pn junction being reverse-biassed in operation of the device, one or more further regions of the one conductivity type surrounding the main pn junction adjacent the given surface so that each further region forms a photosensitive pn junction with the second region, the further region(s) lying within the spread of the depletion region of the main pn junction when the main pn junction is reverse-biassed in operation of the device so as to increase the breakdown voltage of the main pn junction, and means for transmitting light into the semiconductor body via the given surface to enable photogeneration of charge carriers in the vicinity of the photosensitive pn junction(s).

Thus, in a photosensitive device embodying the invention, the one or more further regions form(s) an edge termination system to enable high voltage operation of the device and at the same time provide(s) the photosensitive pn junction(s) so that, if an increase in the area of the edge termination system is required in order to provide a high voltage device, far from causing the light collecting area to be reduced, the light collecting area may increase with the area taken up by the edge termination. The one or more (hereinafter "further region") further region may adjoin and surround the first region, the further region extending outwardly from the first region so as to be less deep than the first region at a point remote from the first region. Thus, for example, the further region may be shallower than the first region so as to reduce the curvature of the pn junction with the second region or alternatively two or more such further regions surrounding the main pn junction and adjoining or connecting with the adjacent such further region or first region may be provided, the further regions becoming more shallow further away from the first region.

The further region may be of substantially uniform depth. In one arrangement, the further region may adjoin and surround the first region and be more lowly doped than the first region, the doping and depth of the further region being such that, when the main pn junction is reverse-biassed in operation of the device, the further region is substantially fully depleted of free charge carriers. Such a further region forms a RESURF (REduced SURface Field) region, the product Nd of the dopant concentration N (in atoms cm$^{-3}$) of the RESURF region and the thickness or depth d(in cm) of the RESURF region being approximately $2 \times 10^{12}$ cm$^{-2}$ for the RESURF region to be substantially fully depleted of free charge carriers in operation of the device where the semiconductor material is silicon. Such a RESURF region may form the only edge termination or may be provided in conjunction with the junction shaping further regions described above, the RESURF region then forming the outermost of the further regions adjoining the first region.

In another arrangement, at least one further region may surround the first region and be spaced apart from the first region by the second region. A number of such further regions may be provided, the further regions being spaced-apart by the second region from one another and the first region and being arranged to surround the first region. Such further regions may be in the form of islands spaced-apart from one another and arranged in a pattern surrounding the first region or may be annular and surround the first region or a combination of islands and annuli may be provided.

As used herein, the term annular should be understood to include not only circular annuli but also other frames or borders, for example, generally oval, hexagonal or rectangular annuli or borders.

The further region may incorporate an additional region of the opposite conductivity type adjacent the given surface. Thus, for example, where further regions are provided in the form of annuli or islands spaced apart from each other and the first region by the second region, each annulus or island may contain an inner coaxial annulus or island of the opposite conductivity type. Another region of the opposite conductivity type may be provided within the first region so as to form a transistor structure, in which case the additional or inner regions may be formed at the same time as the said other region by using an appropriate mask. The further region(s) may be formed at the same time as the first region using an appropriate mask and the same mask may be used to form the additional and emitter regions, such an arrangement having the advantage that any pinhole defects in the mask should not cause problems as the later diffusion and/or implantation step will be masked by the preceding step.

BRIEF DESCRIPTION OF THE DRAWING

Embodiments of the invention will now be described, by way of example, with reference to the accompanying drawings, in which.

Figure 1:
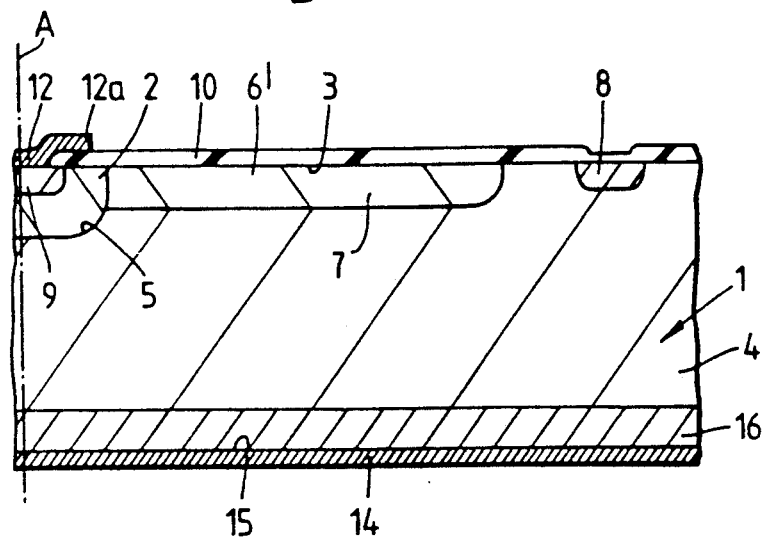
FIG. 1 shows a schematic cross-sectional view of part of one embodiment of a photosensitive device in accordance with the invention.

It should be understood that the Figures are not drawn to scale and that various portions of the devices are shown exaggerated or reduced in size for the sake of convenience. Corresponding and similar features in the different Figures are generally indicated by the same or similar reference numerals.

DESCRIPTION OF THE PREFERRED EMBODIMENTS

Referring firstly to FIG. 1, the photosensitive device shown, which may be symmetrical about an axis A, comprises a semiconductor body 1 (for example of monocrystalline silicon) having a first region 2 of one conductivity type (P+ conductivity type in this example, the plus sign indicating relatively high doping) meeting a given surface 3 of the semiconductor body 1. A second region of the opposite conductivity type, in the example shown of n-conductivity type (where the minus sign indicates relatively low doping) in the form of a substrate layer 4 of the semiconductor body surrounds the first region 2 so as to form with the first region 2 a main pn junction 5 which terminates at the given surface 3 and which in operation of the device is reverse-biassed. A further region 6 of the one conductivity type (P-type in this example) surrounds the main pn junction 5 at the given surface 3 so as to be within the spread of the depletion region of the main pn junction 5 when the main pn junction 5 is reverse-biassed in operation of the device. The further region 6 acts to provide field relief by spreading the depletion region of the main pn junction 5 sideways (that is laterally outwardly) of the main pn junction 5 so as to increase the breakdown voltage of the planar main pn junction 5 beyond the voltage at which the main pn junction 5 would have broken down in the absence of the further or field relief region 6.

In the arrangement shown in FIG. 1, the field relief region 6 is a RESURF (REduced SURface Field) region 6' which adjoins and extends outwardly from the first region 2, thus forming a relatively wide (in a direction along the surface 3) annular region around the first region. The RESURF region 6' acts to spread the depletion region laterally of the main pn junction 5 because the dopant concentration N (in atoms cm$^{-3}$) of the RESURF region 6' is arranged to be sufficiently low and the thickness d (in cm) of the region 6' is arranged to be sufficiently small that the region 6' will be substantially fully depleted of free charge carriers before the reverse voltage across the main pn junction 5 reaches the voltage at which the main pn junction 5 would have broken down in the absence of the RESURF region 6'. The product Nd of the dopant concentration and the thickness of the RESURF region 6' should be approximately $2 \times 10^{12}$ cm$^{-2}$ where the semiconductor body is formed of monocrystalline silicon to ensure that the region 6' is substantially fully depleted of free charge carriers as required when the main pn junction 5 is reverse biassed in operation of the device.

The field relief region 6' forms a photosensitive pn junction 7 with the second region or substrate layer 4. A highly doped region 8 of the opposite conductivity type (N+ type in this example) is provided at the given surface 3 spaced-apart from the field relief region 6' to act as a channel stopper.

The photosensitive device shown in FIG. 1 has a transistor structure. Thus, the first region 2 forms the base region and the substrate layer 4 forms the collector region so that the main pn junction 5 forms a collector-base pn junction of the transistor and a further region 9 of the opposite conductivity type (N+ conductivity type in this example) meeting the given surface 3 is provided within the first region 2 so as to form the emitter region of the transistor structure.

An optically transparent passivating layer 10 extends on the given surface 3 over the channel stopper region 8 and the field relief region 6'. A window is formed within the passivating layer 10 over the emitter region 9 and metallization 12 deposited to contact the emitter region 9. The metallization 12 may extend onto the passivating layer 10 over the first region 2 to act as a field plate 12a for the emitter-base pn junction 11.

Metallization 14 is similarly provided on the surface 15 of the semiconductor body 1 opposite the given surface 3 to provide a collector contact. In order to ensure a good electrical contact a layer 16 of the substrate 4 adjacent the surface 15 is formed so as to be highly doped (N+ conductivity type in this example).

The photosensitive device shown in FIG. 1 may have any desired geometry when viewed in plan, that is when looking downwardly onto the given surface 3. Thus, for example, the various regions 2, 9, 6' and 8 may have a circular geometry with the field relief region 6' and the channel stopper region 8 being in the form of circular annuli when viewed in plan. Alternatively the regions 2, 9, 6' and 8 may have for example a rectangular or hexagonal geometry when viewed in plan, although in such cases care should be taken to ensure that the corners of the regions are rounded off to reduce the curvature of the pn junctions at the corners so as to reduce local and undesirable high electric field spots.

The photosensitive device shown in FIG. 1 may be manufactured using existing semiconductor technology. Thus, the substrate layer 4 may be lowly doped n-type monocrystalline silicon and the regions 2, 9, 6' and 8 and layer 16 may be formed by diffusion and/or ion implantation in a known manner using appropriate masks where necessary. The dopant used to produce the p type conductivity regions (regions 2 and 6' in this example) may be boron while that used to produce the n type conductivity regions (regions 8,9 and layer 16 in this example) may be arsenic or phosphorus. In one particular example, the substrate layer 4 may be 100 micrometers thick and have a dopant concentration of $1 \times 10^{14} cm^{-3}$ while the first region 2 and the emitter region 9 (and the channel stopper region 8 which may be formed at the same time as the emitter region 9 by using an appropriate mask) may have, respectively, a thickness of 5 micrometers and 2 micrometers and have a surface dopant concentration of $1 \times 10^{18}$ atoms $cm^{-3}$ and $1 \times 10^{20} cm^{-3}$. The RESURF region 6 may, typically, be of 3 micrometers thickness and have a surface dopant dose of $2 \times 10^{12}$ atoms $cm^{-3}$.

As an example, the passivating layer 10 may be an insulating layer, for example, a layer of silicon dioxide, or a non-insulating but highly resistive layer, for example a layer of oxygen doped polycrystalline silicon, or a composite layer comprising a highly resistive layer on top of an insulating layer. Of course, in any arrangement, the passivating layer should be optically transparent, that is capable of transmitting light in the range of wavelengths to which the detector is intended to respond to enable charge carriers to be photogenerated in the vicinity of the photosensitive pn junction 7 or some other means, for example an optically transparent window within the passivating layer should be provided to allow light in the range of wavelengths to which the detector is intended to respond to enter the semiconductor body.

In operation of the device a voltage, typically 1 kV (kilo volt) for the arrangement described above, is applied across the metallization 12 and 14 so as to reverse-bias the main pn junction 5. As the field relief region 6' is designed to be substantially fully depleted of charge carriers in operation of the device, the region 6' serves to spread the depletion region of the main pn junction 5 laterally outwardly of the main pn junction 5. Light (within the wavelength range to which the phototransistor is designed to respond) incident on the passivating layer 10 is transmitted via the given surface 3 into the semiconductor body 1. The incident light generates electron-hole pairs within the semiconductor body. In the vicinity of the photosensitive pn junction 7 the field in the depletion region acts to sweep the photogenerated holes (electrons if the conductivity types given above are reversed) via the depletion region into the base or first region 2 while the photogenerated electrons (holes if the conductivity types given above are reversed) are swept into the collector region 4,16. The photogenerated electrons and holes provide a photocurrent across the collector region 4,16, the holes swept into the base or first region 2 lowering the emitter-base potential to provide electron injection into the base region 2 so resulting in transistor action and providing an output signal related to the incident light intensity.

Figure 2:
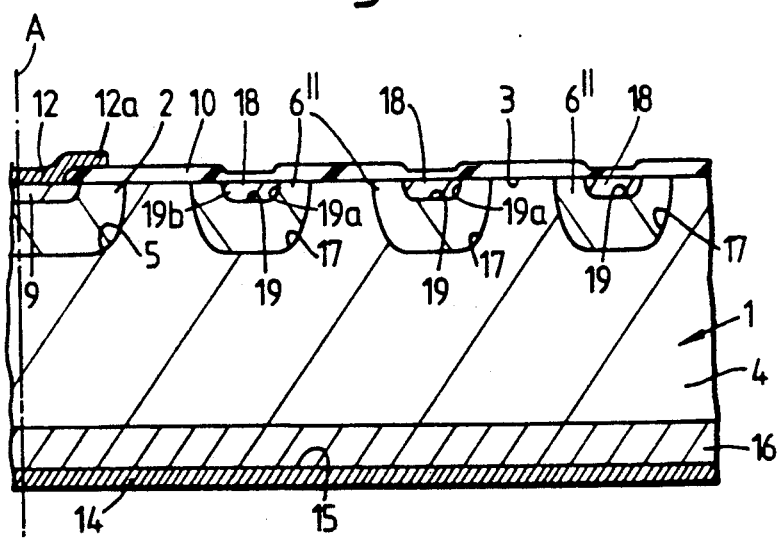
FIG. 2 shows a schematic cross-sectional view of part of another embodiment of a photosensitive device in accordance with the invention.

FIG. 2 illustrates part of a second embodiment of a photosensitive device in accordance with the invention, in which the device again may be symmetrical about the axis A.

The photosensitive device shown in FIG. 2 is, like the device shown in FIG. 1, a phototransistor and differs from the device shown in FIG. 1 essentially in that the RESURF field relief region 6' is replaced by one or more (three are shown but less or more could be provided depending upon the desired breakdown voltage) annular floating field relief regions 6" of the one conductivity type (p+ conductivity type in this example) each of which forms a photosensitive pn junction 17 with the second region or substrate layer 4 and surrounds the main pn junction 5, the field relief regions 6" serving to spread the depletion region of the main pn junction 5 laterally outwardly so as to increase the reverse breakdown voltage of the main pn junction 5 beyond that at which the junction 5 would have broken down in the absence of the field relief region(s) 6". The floating region(s) 6" thus is (are) situated within the spread of the depletion region of the main pn junction 5 when the main pn junction 5 is reverse-biased in operation of the device.

Although in the arrangement shown in FIG. 2, the annular floating regions or rings 6" are shown to be of equal width, separation and depth it should, of course, be appreciated that this need not necessarily be the case and that these parameters may be tailored to produce the desired breakdown voltage of the device. Thus, for example the width of the rings 6" may be varied so that the innermost ring (the ring nearest the main pn junction 5) is wider than the other rings 6" as described in EP-A 115 093 The separation and/or depth of the rings may also vary as the distance from the main pn junction 5 increases. Furthermore, although the floating rings 6" are shown to be formed by a single diffusion step, the edges of the floating rings could be contoured by subsequent shallower diffusions as described in EP-A 124 139.

The or each of the floating ring regions 6" may incorporate an inner floating ring region 18 which meets the given surface and is of the opposite conductivity type (n+ conductivity type in this example) so forming with the surrounding floating ring region 6" a pn junction 19 which terminates at the given surface.

As in the arrangement described above in relation to FIG. 1, the field relief region(s) 6" is (are) covered by a passivating layer 10 which may be as described above in relation to FIG. 1. Alternative passivation schemes could, however, be used; for example where more than one ring 6" is provided the rings may be connected by a semi-insulating (for example oxygen-doped polycrystalline silicon) bleeder layer which either extends over an insulating layer and contacts the rings 6" through windows in the insulating layer formed over the rings 6" or extends between the rings 6". Various different forms of surface passivation schemes for floating ring systems are described in, for example, EP-A-115093, 124139 and 182422 and may be suitable, although care should be taken where a passivation scheme involves metallic field plates to ensure either that the field plates are sufficiently thin so as not to reflect too much of the incident light and/or occupy very little of the surface area above the photosensitive junction(s) 17.

The device shown in FIG. 2 may be manufactured using existing semiconductor technology. Thus, the substrate layer 4 may be lowly doped monocrystalline silicon in which the regions 2, 9, 6", 8 and 18 (if provided) are formed by ion implantation and/or diffusion. By using appropriate masks, the floating ring region (s) 6" may be formed at the same time as the first region 2 while the channel stopper region 8 and inner floating ring region(s) 18 (if provided) may be formed at the same time as the emitter region 9. The inclusion of the inner floating ring regions 18 may reduce the possibilities of pinhole failures.

To give a particular example for the photosensitive device shown in FIG. 2, the substrate layer 4 may be a lowly doped n-type monocrystalline silicon substrate layer having a thickness of 100 and a dopant concentration of $1 \times 10^{14}$ atoms cm$^{-3}$ while the first region 2 and floating ring region(s) 6" may be formed by diffusion and/or ion implantation of boron so as to have a surface dopant concentration of $1 \times 10^{18}$ atoms cm$^{-3}$ and a thickness or depth of 5 micrometers and the emitter region 9, channel stopper region 8 and inner floating ring region(s) 18 (if provided), may all be formed by diffusion and/or ion implantation of phosphorus so as to have a surface dopant concentration of $1 \times 10^{20}$ atoms cm$^{-3}$ and a thickness or depth of 2 micrometers. The number, spacing and dimensions of the floating ring regions 6" will of course be chosen so as to provide an optimum structure for the required reverse breakdown voltage of the main pn junction 5.

As in the case of the device shown in FIG. 1, in operation, the main pn junction 5 is reverse-biassed by a voltage applied across the emitter and collector metallization 12 and 14. The thus-formed depletion region of the main pn junction 5 is spread laterally outwardly by the floating ring(s) 6" so that the ring(s) 6" is (are) within the spread of the depletion region. When light (within the wavelength range to which the device is designed respond) is incident on the passivating layer 10 and is transmitted into the semiconductor body, electron-hole pairs are generated within the semiconductor body and, in the vicinity of the photosensitive pn junction(s) 17, the holes of the thus-photogenerated electron-hole pairs are swept by the drift electric field of the laterally spread depletion region towards the first or base region 2 while the electrons are swept into the collector region. Where a number of floating ring regions 6" are provided, the holes of electron hole pairs photogenerated in the vicinity of the outer floating ring regions 6" may, as they are swept towards the base region 2, be absorbed and then reinjected into the depletion region by one or more of the floating ring regions 6" lying between the base region and the area in which the holes were photogenerated where the floating ring region(s) 6" contain(s) inner floating ring region(s) 18.

Part(s) 19a of the pn junction(s) 19 remote from the main pn junction will be forward biassed while the part(s) 19b of the pn junction(s) 19 facing toward the main pn junction 5 will be reverse-biassed. Accordingly, although electrons of electron-hole pairs photogenerated in the vicinity of the inner floating ring region 18 may pass into the inner floating ring regions 18, the forward biassing of the pn junction part(s) 19a may facilitate reinjection of these electrons into the collector region 4, 16 so that they can contribute to the photocurrent.

Figure 3:
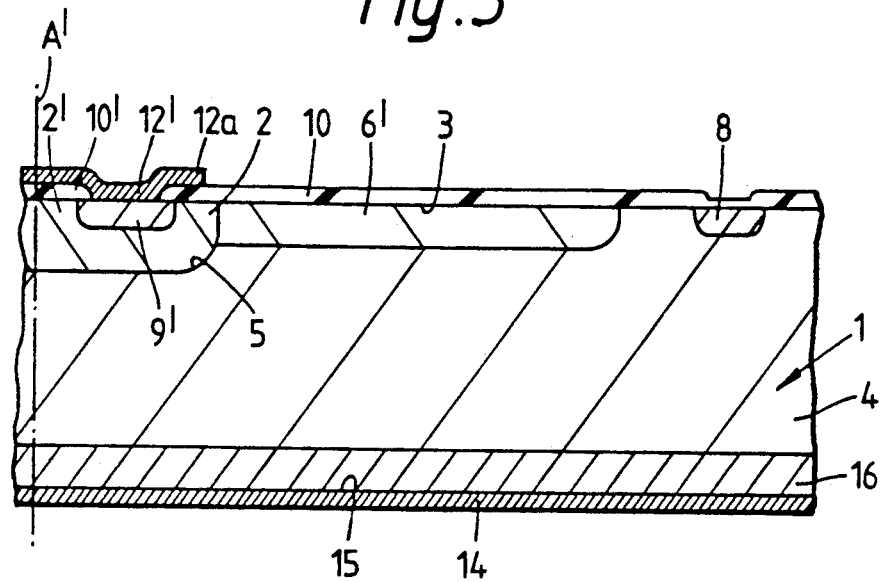
FIG. 3 shows a schematic cross-sectional view of part of a modified version of the photosensitive device shown in FIG. 1.
Figure 4:
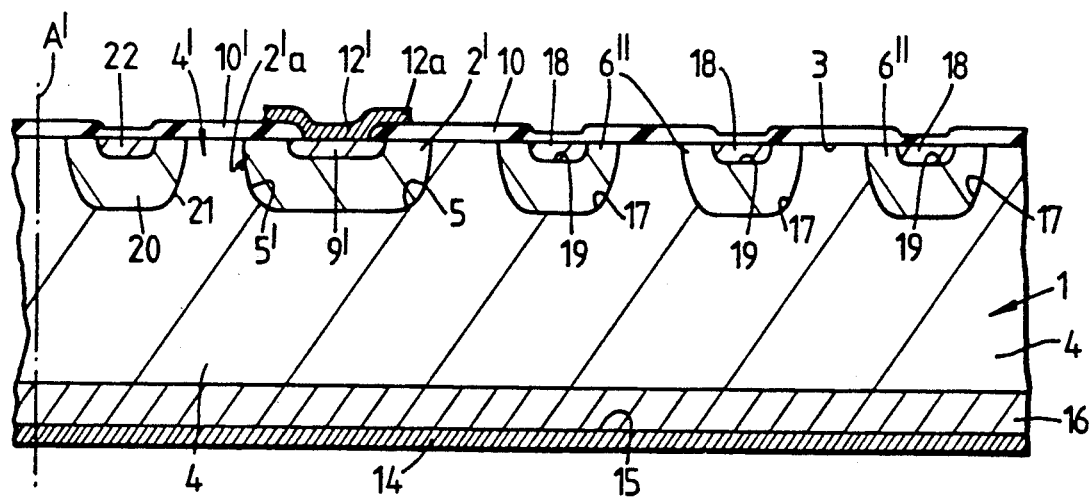
FIG. 4 shows a schematic cross-sectional view of part of a modified version of the photosensitive device shown in FIG. 2.

FIG. 3 illustrates a modified version of the photosensitive device shown in FIG. 1 while FIG. 4 illustrates a similarly modified version of the photosensitive device shown in FIG. 2. Both devices may be symmetrical about the axis A.

In each of FIGS. 3 and 4, the photosensitive device is provided with a hollow emitter region 9' so as to increase the periphery of the emitter while keeping the area of the emitter region small.

Although not shown, when viewed in plan, the hollow emitter region 9' may have, for example, an annular (eg a circular annulus) shape or may have, for example, a back-to-back double comb shape with fingers or teeth of the comb extending transversely of each elongate side of a central spine of the emitter region. In the latter case the fingers and the spine may both be hollow so that the emitter region has a convoluted annular shape and so forms a closed loop, or merely the fingers may be hollow.

Where the emitter region 9 is annular or otherwise hollow, then the base or first region 2 may be similarly hollow. By way of example, FIG. 4 shows a hollow base region 2' while FIG. 3 does not, although the situations could be reversed. If the base region 2' is hollow then one or more interior field relief regions may be provided in the area 4' of the collector region 4 extending up through the base region 2' so as to increase the light collecting area, each interior field relief region providing a photosensitive junction within the device. For example as shown in FIG. 4, one or more interior annular floating ring regions 20 forming photosensitive pn junctions 21 with the collector region 4' and possibly having interior inner floating ring regions 22, may be provided in the collector area 4' adjacent the given surface or a RESURF region, similar to the region 6' in FIGS. 1 and 3, may extend completely across the collector area 4' to contact the inner periphery 2'a of the hollow base region 2'.

Of course, where the emitter region is hollow then, to avoid emitter-base shorting, the window formed within the insulating layer 10 to enable contact to be made to the emitter region 9 by subsequent metallization 12' is modified so as to leave insulating material 10' covering the exposed surfaces of the base or first region 2' (and the collector area 4' in FIG. 4) and overlapping slightly with the emitter region 9' edges.

The devices shown in FIGS. 3 and 4 operate in the same manner as the devices shown in FIGS. 1 and 2, respectively. As far as the interior field relief regions 20 are concerned, light (within the wavelength range to which the device is designed to respond) incident on the passivating layer 10' is transmitted into the semiconductor body where electron hole pairs are generated as in the case of light falling on the remainder of the passivating layer 10. In the vicinity of the photosensitive pn junction(s) 21 the photogenerated holes are swept by the drift region towards the surrounding base region 2' in a manner similar to that described above while the photogenerated electrons are swept into the collector region. Such interior field relief regions could provide the only photosensitive pn junction(s), although for a high voltage device some edge termination system, surrounding the main pn junction, for example a field plate system, would also be required.

The photosensitive devices shown in FIG. 3 and FIG. 4 may be manufactured in a manner similar to that described above in relation to FIG. 1 and FIG. 2, respectively, with appropriate modification of the mask used to form the emitter region (and also the base region in FIG. 4) so as to enable the desired hollow structure to be provided.

It should, of course, be appreciated that, where floating regions are provided, these need not necessarily be in the form of rings or annuli extending round the main pn junction 5 (in the case of interior field relief region(s) round the inner periphery 5' of the main pn junction). Thus, for example, the floating regions may be individual islands arranged in an optimum pattern so as to spread the depletion region of the main pn junction laterally and increase the breakdown voltage of the main pn junction. For example, the floating islands may be arranged in annuli or rings surrounding and concentric with the main pn junction, each annulus being spaced apart from the main pn junction and each other annulus in a manner similar to the ring regions 6" shown in FIGS. 2 and 4. Individual or groups of floating islands may be disposed so as to spread the depletion region outwardly adjacent any region of the first region where the pn junction may have a small radius of curvature, for example at the rounder corners where the device has a rectangular or square geometry.

In another embodiment (not shown), the further or field relief region(s) surrounding the main pn junction may be provided by shaping the pn junction 5 by subsequent shallower diffusion and/or implantation steps so as to reduce the main pn junction 5 curvature. The field relief may be provided merely by such junction shaping or in addition a RESURF field relief region 6' or floating ring(s) 6" may surround the main pn junction 5.

The passivating layer 10 covering the field relief region(s) of the devices described above forms at least part of means for transmitting light to the semiconductor body via the given surface to enable photogeneration of charge carriers. If the photosensitive device is to be housed separately in an encapsulation, then the encapsulation will include an optically transparent window over the passivating layer 10 to enable light to be transmitted into the semiconductor body. The photosensitive device described above may find particular use in an opto-coupler arrangement for isolating loads from a power supply. The light emitting device, for example light emitting diode, of the opto-coupler arrangement may of course be encapsulated or housed separately from the photosensitive device in which case a window will be provided in the encapsulation of the photosensitive device. However, the light emitting device may be encapsulated in the same housing as the photosensitive device, in which case a window in the encapsulation may not be necessary, although some optical arrangement may be desirable to ensure that light from the light emitting device is transmitted efficiently to the semiconductor body of the photosensitive device via the given surface 3.

A photosensitive device embodying the invention may be used in a "bean stalk stack" optocoupler arrangement, where several light emitting devices are connected in series and several light receiving devices are connected in series with each light emitting device forming an optocoupler with a respective one of the light receiving devices. The use of photosensitive transistors in accordance with the invention having floating rings providing the photosensitive pn junctions, for example as in the arrangements shown in FIGS. 2 and 4, may be advantageous in promoting voltage sharing between the photosensitive transistors. Thus the base current to the photosensitive transistor from the photogeneration of electron-hole pairs in the depletion region under, and between, the floating rings should increase with collector voltage because the depletion region extends on the surface across a greater number of floating rings as the voltage is increased (assuming the whole of the surface is illuminated). As a result of the increase in base current, the normal rise of the transistor collector current with collector voltage should be accentuated and so any mismatch in gain or illumination of the transistors should be compensated for by a change in collector-emitter voltage. The change of collector current with voltage due to this effect may be made more linear by suitably adjusting the illumination across the surface 3, for example by increasing the illumination towards the periphery, that is towards the outer(most) floating ring.

The range of wavelengths which can be detected will depend not only on the range of wavelengths for which the passivating layer 10 (and the encapsulation window if present) is optically transparent but also on the material of the semiconductor body. Where the device is a silicon device, then the device may be used to detect light in both the wavelength range visible to the human eye and in the infrared. Of course, if different materials are used the device may be capable of detecting different wavelengths.

Although the photosensitive devices shown in the Figures are phototransistors, the emitter region 9 may, of course, be omitted so as to form a photodiode structure, the metallization 12 then being provided on the first region 2 so as to enable reverse-biassing of the main pn junction 5. A p+ conductivity type layer may be provided between the substrate layer and the metallization 14 instead of the n+ conductivity type layer shown in FIGS. 1 to 4 to form, in the case of the transistor structure shown in the drawings, a photothyristor device and, where the emitter region is omitted, to form an alternative phototransistor structure. The emitter contact of such a phototransistor (or the base contact of such a photodiode) may be connected to the gate of an insulated gate field effect transistor possibly formed in the same substrate so that the photocurrent controls operation of the insulated gate field effect transistor enabling a more sensitive detection of the light incident on the phototransistor or photodiode.

Where the emitter region 9 is omitted in the arrangements shown in FIGS. 1 to 4, the main pn junction 5 may constitute the rectifying junction of the resulting power rectifier diode. The devices need not necessarily be symmetrical about the axis A or A', for example, the rectifying junction of a power rectifier diode in accordance with the invention may be formed by a metal semiconductor Schottky contact in which case the first region 2 will define an annular guard ring surrounding an area of the substrate layer 4 which meets the given surface and to which the Schottky contact is made.

From reading the present disclosure, other modifications will be apparent to persons skilled in the art. Such modifications may involve other features which are already known in the design of semiconductor devices and which may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalization or modification of one or more of those features which would be obvious to persons skilled in the art, whether or not it relates to the same invention as presently claimed in any claim and whether or not it mitigates any or all of the same technical problems as does the present invention.

We claim:

1. A photosensitive device comprising a semiconductor body having a first region of one conductivity type adjacent a surface of the body, a second region of the opposite conductivity type surrounding the first region so as to form with the first region a main pn junction terminating at the surface, the main pn junction being reverse-biassed in operation of the device, at least one further region of the one conductivity type surrounding the main pn junction adjacent the given surface and immediately adjacent said first region so that each further region forms a photosensitive pn junction with the second region, means for increasing the breakdown voltage of the main pn junction and comprising the further region being provided within the spread of the depletion region of the main pn junction when the main pn junction is reverse-biassed in operation of the device, and solid, substantially optically transparent means on said surface for transmitting light into the semiconductor body via the surface to enable photogeneration of charge carriers in the vicinity of the photosensitive pn junction.

2. A photosensitive device according to claim 1, wherein each further region adjoins and surrounds the first region, each further region extending outwardly from the first region so as to be less deep than the first region at a point remote from the first region.

3. A photosensitive device according to claim 2, wherein each further region is of substantially uniform depth.

4. A photosensitive device according to claim 1, wherein each further region adjoins and surrounds the first region and is more lowly doped than the first region, the doping and depth of each further region being such that, when the main pn junction is reverse-biassed in operation of the device, each further region is substantially fully depleted of free charge carriers.

5. A photosensitive device according to claim 1, wherein each further region surrounds the first region and is spaced apart from the first region by the second region.

6. A photosensitive device according to claim 1, wherein a number of further regions are provided, the further regions being spaced apart by the second region from one another and the first region and being arranged to surround the first region.

7. A photosensitive device according to claim 5, wherein each further region is annular and surrounds the first region.

8. A photosensitive device according to claim 1, wherein each further region incorporates an additional region of the opposite conductivity type adjacent the given surface.

9. A photosensitive device according to claim 1, wherein a passivating layer covers each further region.

10. A photosensitive device according to claim 9, wherein the transmitting means comprises the passivating layer and the passivating layer is optically transparent.

11. A photosensitive device according to claim 1, wherein another region of the opposite conductivity type is provided within the first region so as to form a transistor structure.

* * * * *